(12) United States Patent
Straeussnigg et al.

(10) Patent No.: US 11,858,808 B2
(45) Date of Patent: Jan. 2, 2024

(54) SYSTEM AND METHOD FOR FAST MODE CHANGE OF A DIGITAL MICROPHONE USING DIGITAL CROSS-TALK COMPENSATION

(71) Applicant: Infineon Technologies AG, Neubiberg (DE)

(72) Inventors: Dietmar Straeussnigg, Villach (AT); Niccoló De Milleri, Villach (AT); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 312 days.

(21) Appl. No.: 17/209,853

(22) Filed: Mar. 23, 2021

(65) Prior Publication Data

US 2022/0306457 A1    Sep. 29, 2022

(51) Int. Cl.
*B81B 7/00*    (2006.01)
*B81B 7/02*    (2006.01)
*H04R 3/06*    (2006.01)

(52) U.S. Cl.
CPC .............. *B81B 7/008* (2013.01); *B81B 7/02* (2013.01); *H04R 3/06* (2013.01); *B81B 2201/0257* (2013.01); *H04R 2201/003* (2013.01); *H04R 2410/03* (2013.01)

(58) Field of Classification Search
None
See application file for complete search history.

(56) References Cited

U.S. PATENT DOCUMENTS

| 10,244,315 | B2 | 3/2019 | Straeussnigg et al. |
| 10,491,996 | B2 | 11/2019 | De Milleri et al. |
| 2018/0213324 | A1* | 7/2018 | De Milleri ............... H04R 3/04 |
| 2019/0345026 | A1 | 11/2019 | Furst, II et al. |
| 2020/0162099 | A1 | 5/2020 | Perrott |
| 2021/0229980 | A1 | 7/2021 | Straeussnigg et al. |
| 2021/0235200 | A1 | 7/2021 | Straeussnigg et al. |

\* cited by examiner

*Primary Examiner* — Kenny H Truong
(74) *Attorney, Agent, or Firm* — Slater Matsil, LLP

(57) ABSTRACT

A circuit includes a cross-talk compensation component including a power profile reconstruction component for reconstructing the power profile of a digital microphone coupled to a microelectromechanical (MEMS) device, wherein the power profile represents power consumption of the digital microphone over time between at least two operational modes of the digital microphone, and a reconstruction filter for modeling thermal and/or acoustic properties of the digital microphone; and a subtractor having a first input for receiving a signal from the digital microphone, a second input coupled to the cross-talk compensation component, and an output for providing a digital output signal.

20 Claims, 11 Drawing Sheets ized as "cross-talk", "X-talk", or "XT".
SYSTEM AND METHOD FOR FAST MODE CHANGE OF A DIGITAL MICROPHONE USING DIGITAL CROSS-TALK COMPENSATION

TECHNICAL FIELD

The present invention relates generally to a system and method for a fast mode change of a digital microphone using digital cross-talk compensation.

BACKGROUND

Digital microphones typically include a microelectromechanical system (MEMS) device for receiving environmental sound waves in the audio band or lower frequency pressure waves and converting them into an analog signal. The digital microphone also includes an analog-to-digital converter (ADC), as well as other digital processing components, for converting the analog signal into a digital signal. Digital microphones may include the ability to switch between different operational modes in response to a control signal, such as between a higher quality mode having a high signal-to-noise ratio (SNR) and high power dissipation, and a lower quality mode having a low SNR and low power dissipation. Subsequent digital microphone generations may require flexibility in switching between the higher quality mode and the lower quality mode, for example through the use of dynamic SNR adjustment or dynamic power saving strategies. Subsequent digital microphone generations may also require that the dynamic adjustment be performed rapidly and seamlessly by minimizing audible switching artefacts. Audible switching artefacts at the output of the digital microphone can be referred to and are designated herein as "cross-talk", "X-talk", or "XT".

SUMMARY

According to an embodiment, a circuit includes a cross-talk compensation component including a power profile reconstruction component configured for reconstructing the power profile of a digital microphone in communication with a microelectromechanical (MEMS) device, wherein the power profile represents power consumption of the digital microphone over time between at least two operational modes of the digital microphone, and a reconstruction filter configured for modeling thermal and/or acoustic properties of the digital microphone; and a subtractor having a first input configured for receiving a signal from the digital microphone, a second input coupled to the cross-talk compensation component, and an output configured for providing a digital output signal.

According to an embodiment, a digital microphone includes a microelectromechanical system (MEMS) device configured for providing an analog input signal; a front-end circuit coupled to the MEMS device; an analog-to-digital converter (ADC) coupled to the front-end circuit; a first digital filter coupled to the ADC, wherein at least one of the front-end circuit, the ADC, and the first digital filter includes a power profile; a power measurement component configured for measuring power or current of at least one of the front-end circuit, the ADC, and the first digital filter; a power profile reconstruction component in communication with the power measurement component; a reconstruction filter configured for modeling thermal and/or acoustic properties of the digital microphone, wherein the reconstruction filter is in communication with the power profile reconstruction component; and a subtractor having a first input coupled to the first digital filter, a second input coupled to the reconstruction filter, and an output configured for providing a digital output signal corresponding to the analog input signal.

According to an embodiment, a method of operating a digital microphone includes converting an analog input signal from a microelectromechanical (MEMS) device using an analog-to-digital converter (ADC) in the digital microphone, wherein the ADC includes a power profile while switching between first and second operating modes representing power consumption of the ADC as a function of time; reconstructing the power profile; using the reconstructed power profile, determining a cross-talk estimate of the digital microphone; and subtracting the cross-talk estimate from an output signal of the ADC to generate a digital output signal corresponding to the analog input signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
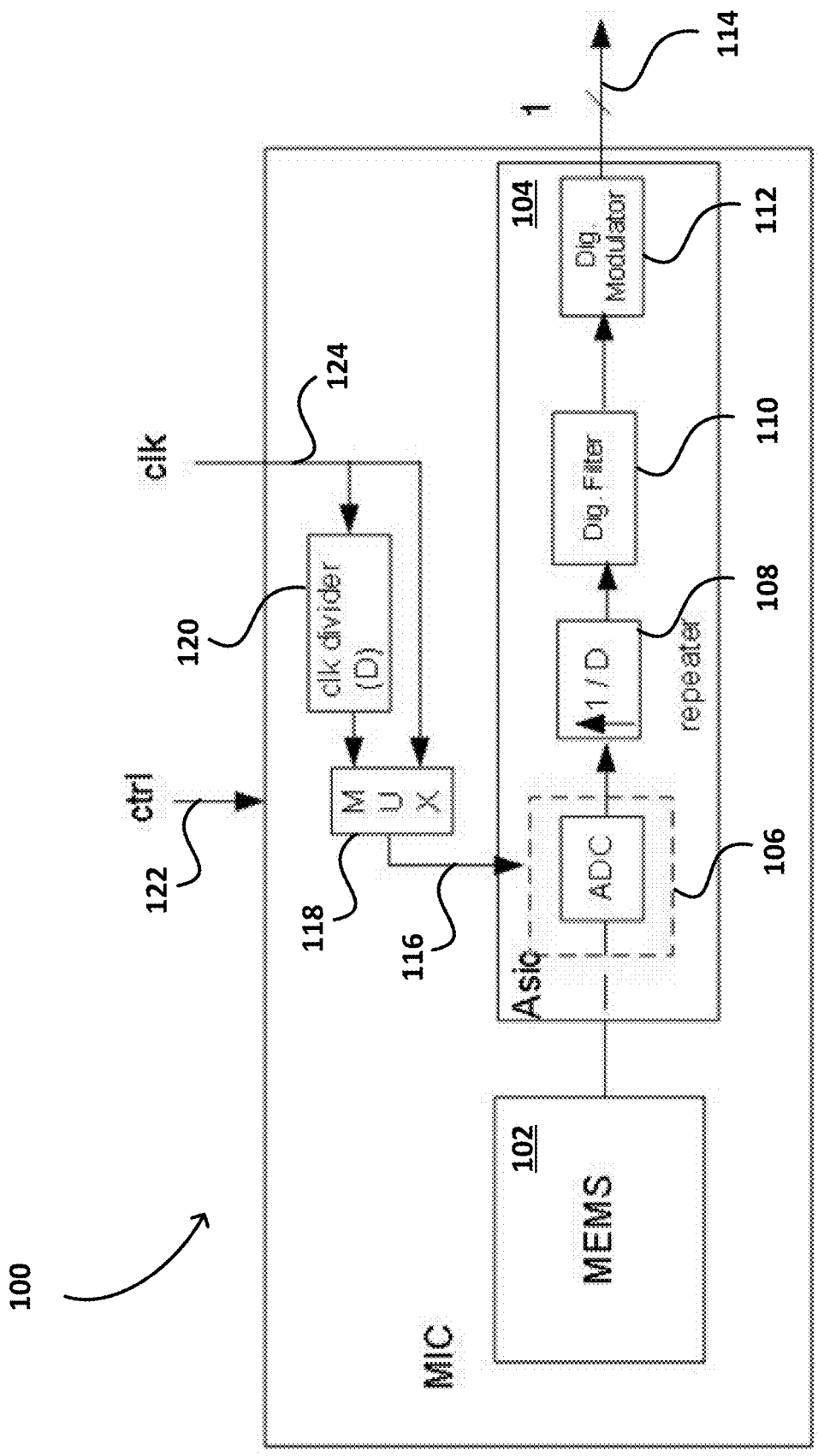
FIG. 1 is a block diagram of an exemplary digital microphone with internal clock changing components.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Although presently available digital microphones provide the ability to switch between the higher quality mode and the lower quality mode, subsequent digital microphone generations may require flexibility in switching between the higher quality mode and the lower quality mode, for example through the use of dynamic SNR adjustment or dynamic power saving strategies. Subsequent digital microphone generations may also require that the dynamic adjustment be performed rapidly and seamlessly by minimizing audible switching artefacts. Audible switching artefacts at the output of the digital microphone can be referred to and are designated herein as "cross-talk", "X-talk", or "XT".

Embodiments described herein reconstruct and subtract X-talk disturbing noise in a digital microphone for various power profile changes due to operational mode changes. In this manner, audible artefacts in the output of the digital microphone produced by the operational mode changes are significantly reduced below an audible threshold. As described herein, the term "power profile" refers to the power dissipation of a digital microphone over time, especially during a time period in which there is a transition between two or more operational modes of operation of the digital microphone.

In some embodiments, the performance of the digital microphone is changed based on a control signal at the left-right (L/R) pin of the digital microphone the power profile. This occurs typically between a lower power/lower performance mode of operation and a higher power/higher performance mode of operation. Various methods are known for changing the mode of operation of a digital microphone. For example, a change can be made to the bias current or clock frequency of the digital microphone, or a change can be made to the value of a sampling capacitor inside of an ADC of the digital microphone. In turn, the change of mode of operation of the digital microphone leads to a change in power, which in some cases causes an audible acoustic artefact. For example, if there is a change of clock frequency from $F_S$ to $F_S/2$ there is a typically change in power consumption of ~300 μW in the digital microphone. In a reconstruction path, according to embodiments, the power profile associated with this change in power consumption is applied as an input to a first reconstruction filter that models the dynamic of the temperature time constant of the MEMS device and a second reconstruction filter models the acoustic high pass frequency response of the MEMS device. In an embodiment, the first reconstruction filter comprises a second order digital filter, and the second reconstruction filter comprises a first order digital filter. The reconstructed thermo-acoustic X-talk is then subtracted from the main signal path in the digital microphone so that audible artefacts in the output of the digital microphone are significantly reduced. In some embodiments, a reduction below an audible threshold is achieved. In other embodiments, only a portion of the reconstructed thermo-acoustic X-talk is subtracted from the main signal path if only a partial compensation mode of operation is desired.

In FIG. 1 a block diagram of a digital microphone 100 including a dynamic change of the internal clock is depicted. Digital microphone 100 includes a MEMS device 102 for converting the environmental sound and pressure waves into an analog signal. The analog signal is received by an Application-Specific Integrated Circuit (ASIC) 104. ASIC 104 comprises an ADC 106 for converting the analog signal from the MEMS device 102 into a digital signal for further digital signal processing. In the digital microphone 100 of FIG. 1 a repeater 108 is coupled to the output of ADC 106, a digital filter no is coupled to the output of repeater 108, and a digital modulator 112 is coupled to the output of digital filter 110 for providing a one-bit digital output signal at output bus 114. Digital microphone 100 receives a clock (clk) signal at node 124, which is received by multiplexer 118 directly at an input, and indirectly at another input through clock divider 120. The output of multiplexer 118 provides the clock signal and a divided version of the clock signal at output 116, which is received in turn by ADC 106. The multiplexer 118, the clock divider 120, and the repeater 108 are all under control of a control signal (ctrl) 122.

To achieve flexibility in terms of performance (SNR) and/or power consumption, different clock rates generated by the clock divider 120 from the constant incoming clock rate (clk) can be used. The different clock rates can range from a reduced internal clock rate (clkred=clk/D) to the high clock rate due to the action of the repeater 108 interpolating at a factor D under control of the ctrl control signal 122. Further details of the digital microphone 100 shown in FIG. 1 are disclosed in co-pending U.S. patent application Ser. Nos. 16/773,079 and 16/871,546, both of which are entitled "Configurable Microphone using Interval Clock Changing", and both of which are hereby incorporated by reference in their entireties.

Another strategy to achieve the flexibility in terms of performance (SNR) and/or power consumption in one or more operational modes is by changing the sampling capacitor of the ADC in the digital microphone.

Figure 2:
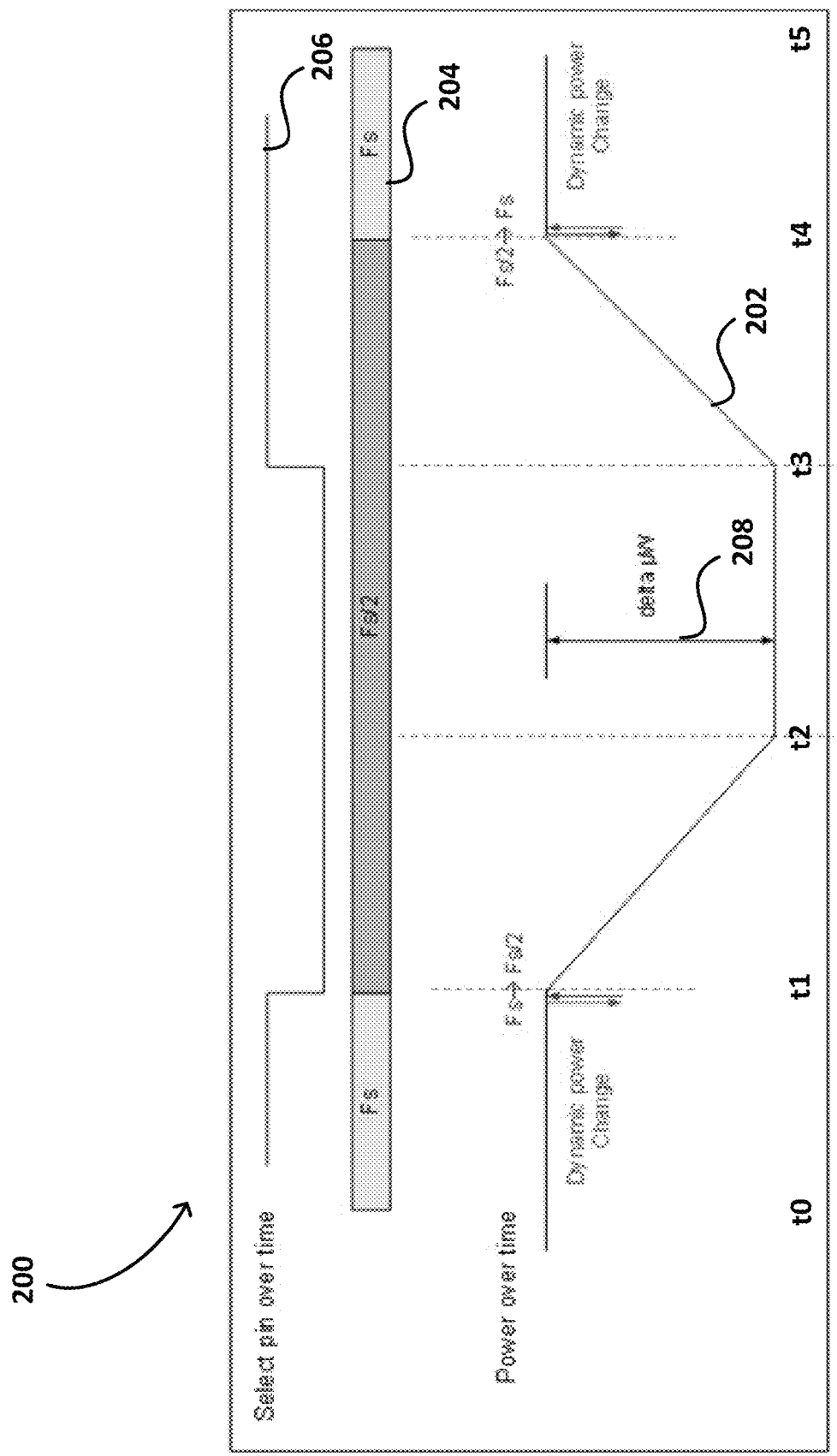
FIG. 2 is a timing diagram of a power profile of the digital microphone of FIG. 1.

In FIG. 2 a timing diagram 200 of the power profile over time of the internal clock change of the digital microphone 100 of FIG. 1 is depicted. Timing diagram 200 includes the timing waveform 206 of a select pin of the digital microphone over time. In FIG. 2, digital microphone 100 transitions from a higher performance operational mode having the full rate clock frequency $F_S$, to a lower performance operational mode having a half-rate clock frequency $F_S/2$, back to the higher performance operational mode having the full rate clock frequency $F_S$. As is shown in the clock timing bar 204, the transition of the falling edge of the select pin waveform 206 are simultaneous with the transition from the $F_S$ clock rate to the $F_S/2$ clock rate. However, the transition of the subsequent rising edge of the select pin waveform 206 with the transition from the $F_S/2$ clock rate to the $F_S$ clock rate is not simultaneous. There is a lag in the transition to the $F_S$ clock rate due to the ramped change of the internal bias current of digital microphone 100 as is explained in further detail below. Timing diagram 200 also shows the power consumption over time. The power profile 202 is at a maximum between time instances $t_0$ and $t_1$, and ramps down to a lower power consumption between time instances $t_1$ and $t_2$, and stays at the lower power consumption between time instances $t_2$ and $t_3$. The difference between the maximum power consumption and the lower power consumption is shown as "delta μW" 208 in FIG. 2 and is about 300 μW in embodiments. The power profile ramps up to the full power consumption between time instances $t_3$ and $t_4$, and returns to the full power consumption between time instances $t_4$ and $t_5$. As noted in the timing diagram of FIG. 2, the dynamic power change at time instance $t_1$ is negative as the clock frequency changes from $F_S$ to $F_S/2$, whereas the dynamic power change at time instance $t_4$ is positive as the clock frequency changes from $F_S/2$ back to $F_S$.

Thus, as the internal clock is changed, a change of the dynamic current (power) occurs immediately, which should be compensated to avoid audible artefacts due to thermo-acoustic cross-talk. To reduce spikes in the dissipated power, in the case of a change of the internal clock frequency from $F_S$ to $F_S/2$, the bias current is reduced slowly (ramped) to avoid such audible artefacts. The same ramped strategy can be applied in the case of a change from $F_S/2$ to $F_S$ as noted above.

In the case of changing the sampling capacitor to achieve the different operational modes in a digital microphone, the same ramped power profile can be followed.

While using slow ramps may decrease or even audible artefacts, the corresponding transitions between the desired operational modes of the digital microphone will be slow. For effective reduction of the audible artefacts, the ramping of the internal power consumption can take place over hundreds of milliseconds in some cases. However, in many applications it is desirable that the transitions between operational modes of the digital microphone be effectuated as rapidly as possible, but still without generating audible artefacts.

Embodiments of a digital noise compensation system and method are shown and described in further detail below in order to significantly reduce audible artefacts in a digital microphone, while allowing for the rapid transition between operational modes of the digital microphone.

Figure 3:
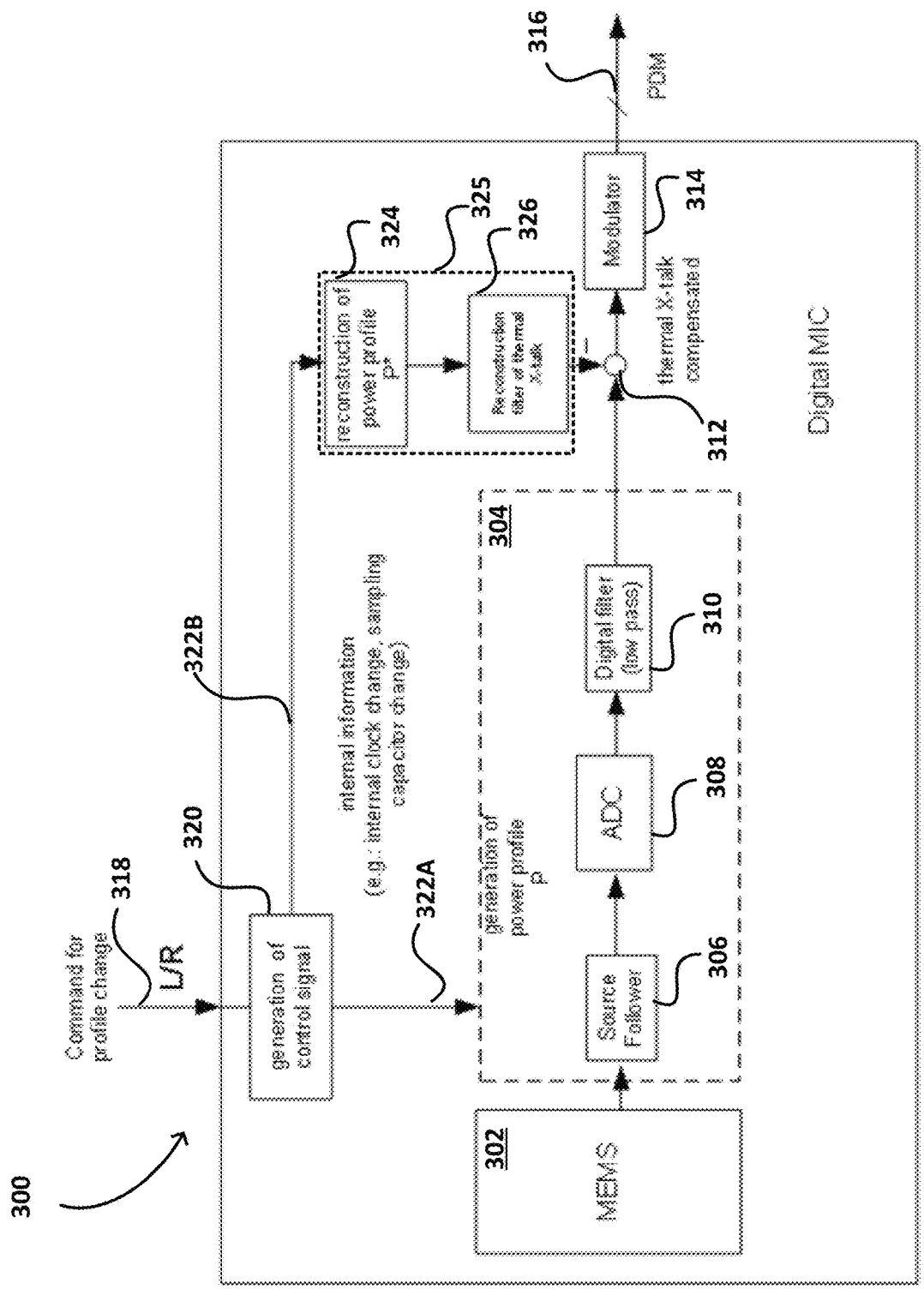
FIG. 3 is a block diagram of a digital microphone with X-talk compensation inside of the digital microphone package, according to an embodiment.

FIG. 3 is a block diagram of a digital microphone 300 with X-talk compensation inside of the digital microphone package, according to an embodiment. Digital microphone 300 includes a MEMS device 302 coupled to an ASIC 304. In an embodiment, ASIC 304 includes an analog front-end circuit 306 such as a source-follower circuit coupled to an ADC 308. In an embodiment, ADC 308 comprises a voltage-controlled oscillator ADC (VCO ADC) coupled to a digital low pass filter 310. MEMS device 302 and ASIC 304, along with modulator 314 described in further detail below, comprise the core components or circuits of the main signal path of digital microphone 300. In embodiments, a source-follower circuit can be used independently if a switch-capacitor sigma-delta ADC or a VCO ADC is used.

In the digital microphone 300 of FIG. 3 an external command over the L/R pin or input at node 318 is used to initialize a dynamic profile change. Based on this command internal information is derived by a "generation of control signal" component 32o to adapt the configuration of the digital microphone 300 (to effectuate either an internal clock change or a change of a sampling capacitor), which in turn leads to a change in the power profile "P" and therefore causes X-talk. A first internal control signal 322A is therefore used to control the internal clock change or sampling capacitor change, and is received by ASIC 304 as shown.

To compensate the X-talk, it is estimated digitally by a X-talk compensation component 325, which can also be referred to as a "reconstruction path" according to embodiments. The X-talk compensation component receives a copy 322B of the first internal control signal in an embodiment. X-talk compensation component 325 includes power profile reconstruction component 324 (for reconstructing the power profile "P", and to generate a reconstructed power profile "P*") and reconstruction filter 326 (which reconstructs thermal and acoustic properties of the X-talk originating in digital microphone 300). For modelling the thermal/acoustic properties, all of the thermal/acoustic properties of the entire digital microphone assembly are ideally considered. For example, the volume of ASIC 304, the thermal contacts of ASIC 304 to the surroundings, the package size(s) of digital microphone 300, the thermal sensitivity of MEMS device 302, the amount of encapsulation (e.g. "glob-top") used to encapsulate ASIC 302, as well as many other thermal and acoustic properties can be considered to achieve an accurate X-talk estimate.

The output signal of X-talk compensation component 325 is subtracted from the main digital signal path of digital microphone 300. Thus the output digital filter 310 in ASIC 304 is received by a first input of subtractor 312, and the output of X-talk compensation component 325 is received by a second input of subtractor 312. The output of subtractor 312 is received by modulator 314 to generate a one-bit pulse modulation density (PDM) signal at digital output bus 316, according to embodiments.

The power reconstruction profile 324 comprises digital or analog components for reconstructing the power profile of the digital microphone through the use of direct power or current measurements, as is explained in further detail below, especially with respect to FIG. 5 and FIG. 6.

The reconstruction filter 326 is described in further detail below, especially with respect to FIG. 7. Additional details regarding reconstruction filter 326 can be found in U.S. Pat. No. 10,491,996 entitled "Micro-Electro-Mechanical System (MEMS) Circuit and Method for Reconstructing an Interference Variable" that is hereby incorporated by reference in its entirety. Additional details regarding reconstruction filter 326 can also be found in U.S. Pat. No. 10,244,315 entitled "Circuit Arrangement with an Optimized Frequency Response and Method for Calibrating a Circuit Arrangement" that is hereby incorporated by reference in its entirety.

Figure 11:
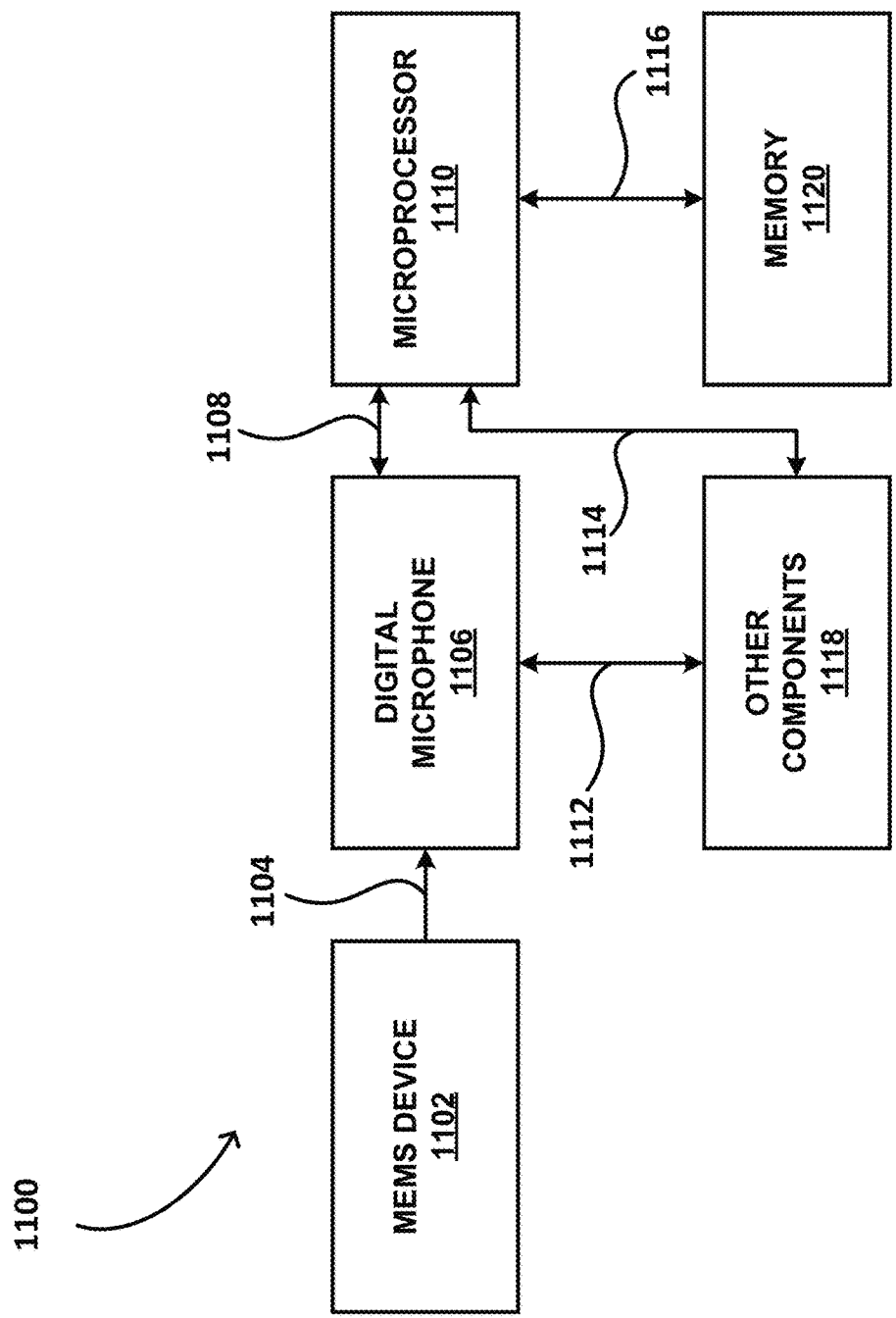
FIG. 11 is a block diagram of a digital microphone system, according to an embodiment.

In FIG. 3, the X-talk compensation component 325 can be integrated together with ASIC 304 in a single integrated circuit, in an embodiment. In other embodiments, the X-talk compensation component 325 can be integrated on a first integrated circuit, and ASIC 304 can be integrated on a second integrated circuit. Both the first integrated circuit and the second integrated circuit can be packaged together in a single semiconductor package, according to embodiments. Other packaging implementations can be used in embodiments. The various components shown in FIG. 3 can be implemented as hardware components such as discrete or integrated circuits, or can be software components comprising instructions stored in memory and implemented by a microprocessor (not shown in FIG. 3 but is best seen in FIG. 11, described in further detail below). Any appropriate mixture of hardware and software components can be used, according to embodiments. Hardware components can comprise integrated circuits or discrete circuit components in various embodiments.

Figure 4:
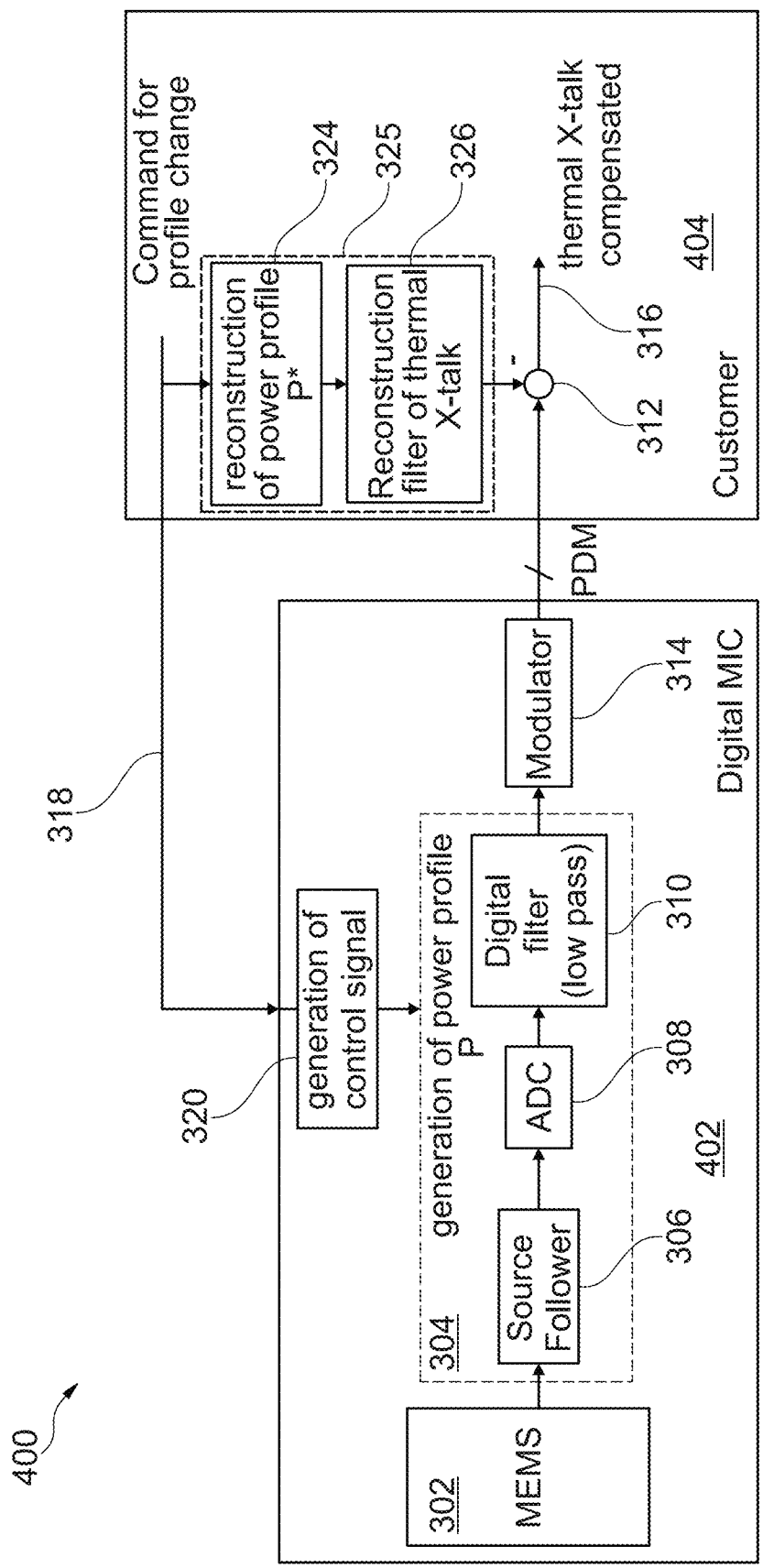
FIG. 4 is a block diagram of a digital microphone with X-talk compensation external to the digital microphone package, according to an embodiment.

The reconstruction of the X-talk can be implemented also outside of the package of the digital microphone, as depicted in FIG. 4, according to embodiments. FIG. 4 shows a digital microphone 400, wherein the MEMS device 302, ASIC 304 including the front-end circuit 306, ADC 308, digital filter 310, modulator 314, and control signal component 320 are implemented in a first semiconductor package 402. The X-talk compensation component 325 including power profile reconstruction component 324 and reconstruction filter 326, along with subtractor 312 are implemented in a second semiconductor package 404. In embodiments, the first semiconductor package 402 and the second semiconductor package 404 can be implemented on a single substrate such as a printed circuit board (PCB). The control signal at node 318 is received by the first semiconductor package 402 and the second semiconductor package 404 in the implementation of FIG. 4. The PDM signal generated by modulator 314 in the first semiconductor package 402 is received by an input of subtractor 312 in the second semiconductor package 404. All other signals and components are substantially as described in digital microphone 300 described in FIG. 3. In embodiments the assembled first semiconductor package 402 can be provided by a digital microphone manufacturer, and the assembled second semiconductor package 404 can be provided by a digital microphone customer.

Figure 5:
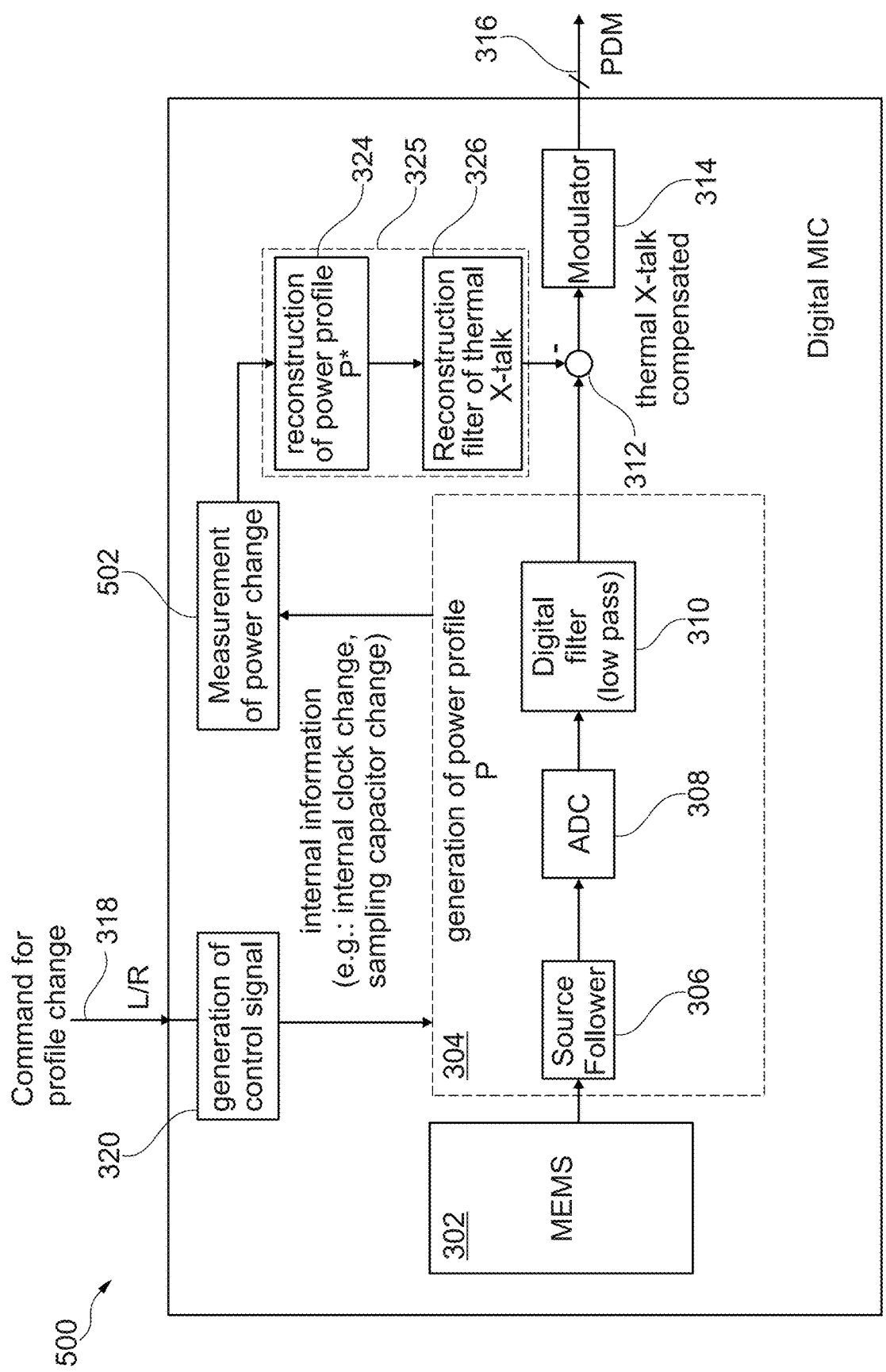
FIG. 5 is a block diagram of a digital microphone with X-talk compensation using measured power dissipation change information, according to an embodiment.

The reconstruction of the power profile, if a dynamic change of the profile (SNR versus power) is applied, can also be based on measurements (e.g. measurement of bias current that defines the power consumption of the digital microphone) as is shown in digital microphone 500 of FIG. 5. Digital microphone 500 includes the MEMS device 302, ASIC 304 including front-end circuit 306, ADC 308, digital filter 310, subtractor 312, modulator 314, control signal generation component 320, X-talk compensation component 325 including power profile reconstruction component 324 and reconstruction filter 326 all previously described and shown in digital microphone 300 of FIG. 3. However, in addition, digital microphone 500 includes a power change measurement component 502 having an input coupled to a power terminal of ASIC 304 and an output coupled to the input of X-talk compensation component 325. In an embodiment, power change measurement component 502 need not necessarily receive a control signal and can continuously provide the power change measurement.

Figure 6:
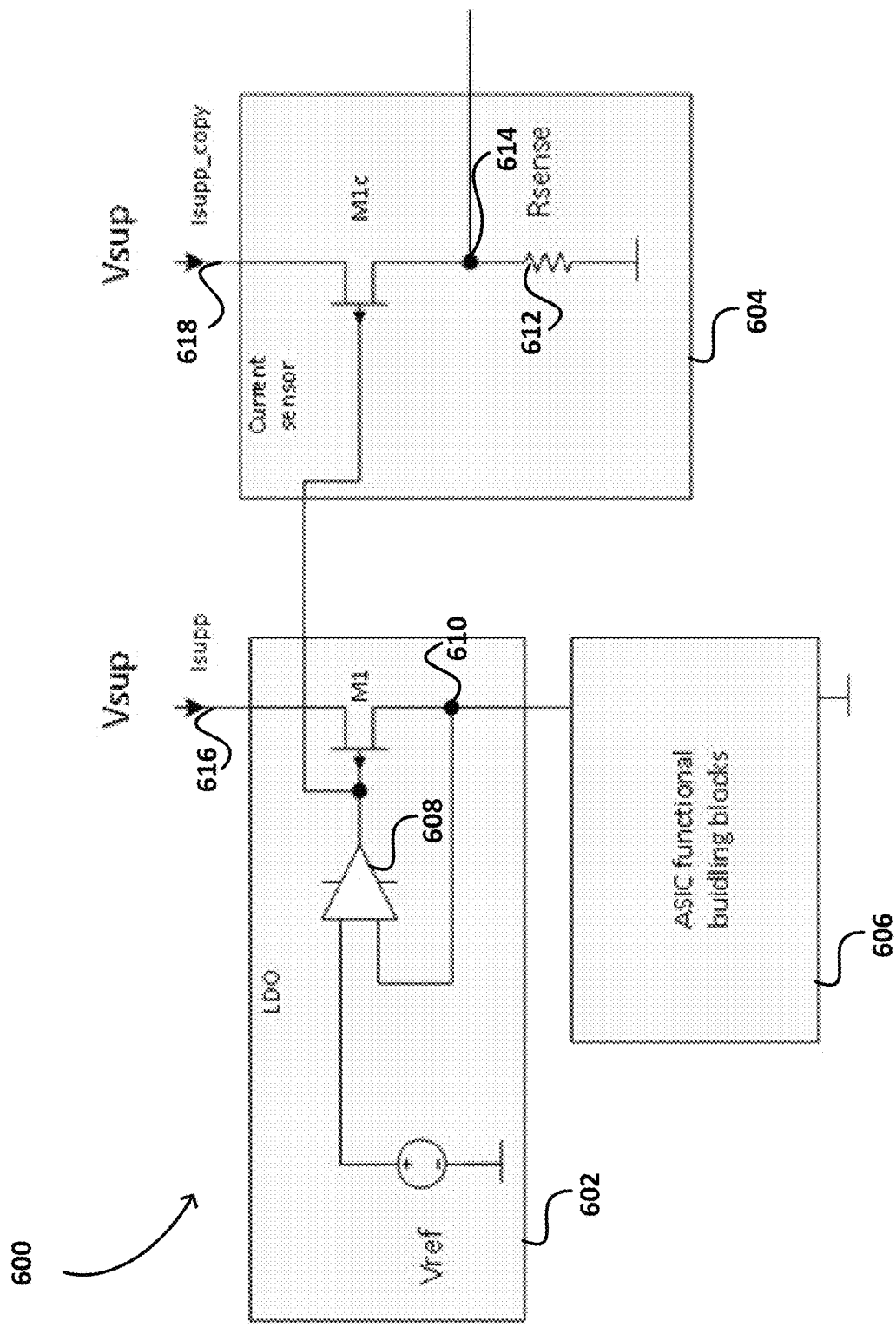
FIG. 6 is a schematic diagram of a power measuring circuit for measuring the power dissipation change in the digital microphone of FIG. 5, according to an embodiment.

FIG. 6 is a schematic diagram of a power measuring circuit 600 for measuring the power dissipation change or bias current change in the digital microphone 500 of FIG. 5, according to an embodiment. According to an embodiment, power dissipation over time can be measured by using a low-dropout voltage regulator (LDO) in series with the power terminal of the digital microphone, and measuring the current of the LDO with a replica circuit. In embodiments, the design of power measuring circuit can be made relatively simply in order to save integrated circuit size and cost.

Power measuring circuit 600 thus comprises an LDO voltage regulator 602 coupled to a current sensor 604, in an embodiment. LDO 602 is coupled to the power terminal of ASIC functional building blocks 606 at node 610, which can represent the functional blocks of ASIC 304 previously shown and described, or include additional or fewer functional blocks. LDO 602 comprises a reference voltage input coupled to a $V_{REF}$ reference voltage source, and a current input coupled to a power supply node of ASIC functional building blocks 606 at node 610. LDO 602 comprises an operational amplifier 608 having a first input for receiving the VREF reference voltage, a second input coupled to node 610, and an output. LDO 602 also comprises an MOS transistor M1, wherein the current flowing through transistor M1 is designated $I_{SUPP}$, which is the supply current through ASIC functional building blocks 606. The gate of transistor M1 is coupled to the output of operational amplifier, and the current path of transistor M1 is coupled between a source of supply voltage $V_{SUP}$ and node 610. Power measuring circuit 600 also includes a current sensor 604, wherein the current sensor comprises an MOS transistor M1C and a sense resistor 612 coupled to a source of MOS transistor M1C at output node 614. In an embodiment sense resistor 612 can also be coupled to ground. The gate of MOS transistor M1C is coupled to the gate of MOS transistor M1. The current path of MOS transistor M1C is coupled between a source of supply voltage $I_{SUPP\_COPY}$ and output node 614. The voltage at output node 614 is thus a continuous measure of the power supply dissipation of ASIC functional building blocks 606 and generates the replica P* power profile.

Figure 7:
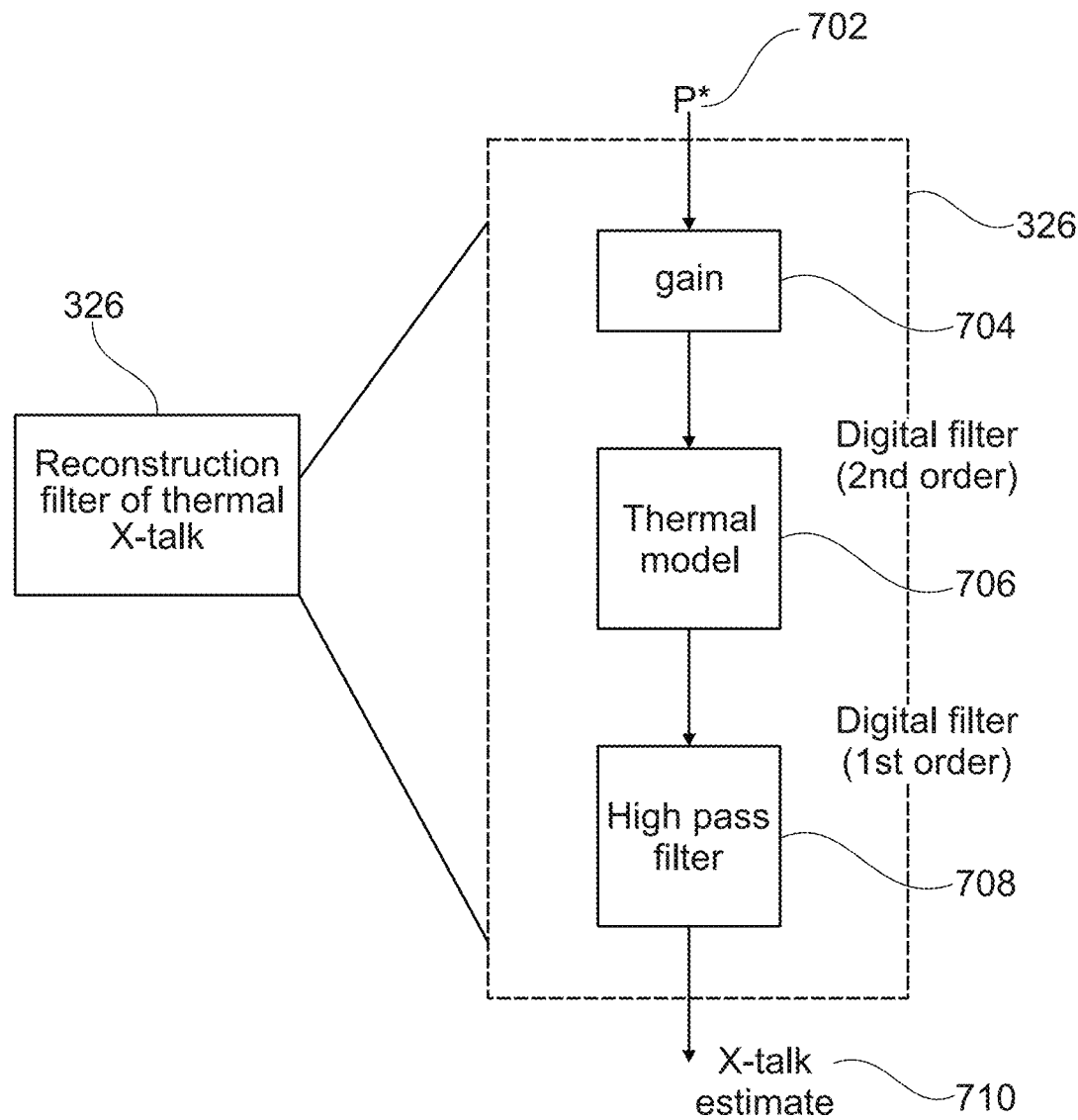
FIG. 7 is a block diagram of a reconstruction filter that is used in any of the digital microphones of FIG. 3, FIG. 4, or FIG. 5.

FIG. 7 is a block diagram of reconstruction filter 326 that is used in any of the digital microphones of FIG. 3, FIG. 4, or FIG. 5. Reconstruction filter 326 receives the replica P* power profile as an input signal 702 to a gain stage 704. An output of gain stage 704 is coupled to a first digital filter 706. An output of first digital filter 706 is coupled to a second digital filter 708. The output of second digital filter 708 provides a digital X-talk estimate 710.

The thermal behavior of MEMS device 302 is modelled by the first digital filter 706 using a second order digital infinite impulse response (IIR) filter (thermal model). The acoustic high-pass behavior of the MEMS device 302 is modelled by the second digital filter 708 using a first order high-pass digital filter. The input signal P* is the estimated power change (replica power profile) due to the dynamic mode change of the digital microphone being used. Gain stage 704, first digital filter 706, and second digital filter 708 can be implemented as digital circuits in, for example, an integrated circuit, or can be implemented through software instructions stored in memory in conjunction with a microprocessor.

The disturbing noise generated by the digital microphone varies according to different sizes and shapes of the MEMS device 302. Subtracting the same compensation signal from the main signal path of the digital microphone will therefore not adequately compensate out the disturbing noise. In order to adapt to the varying disturbing signals, the reconstruction filter 326 is advantageously implemented as an adaptive filter by adjusting to the changing interfering signal.

Figure 8:
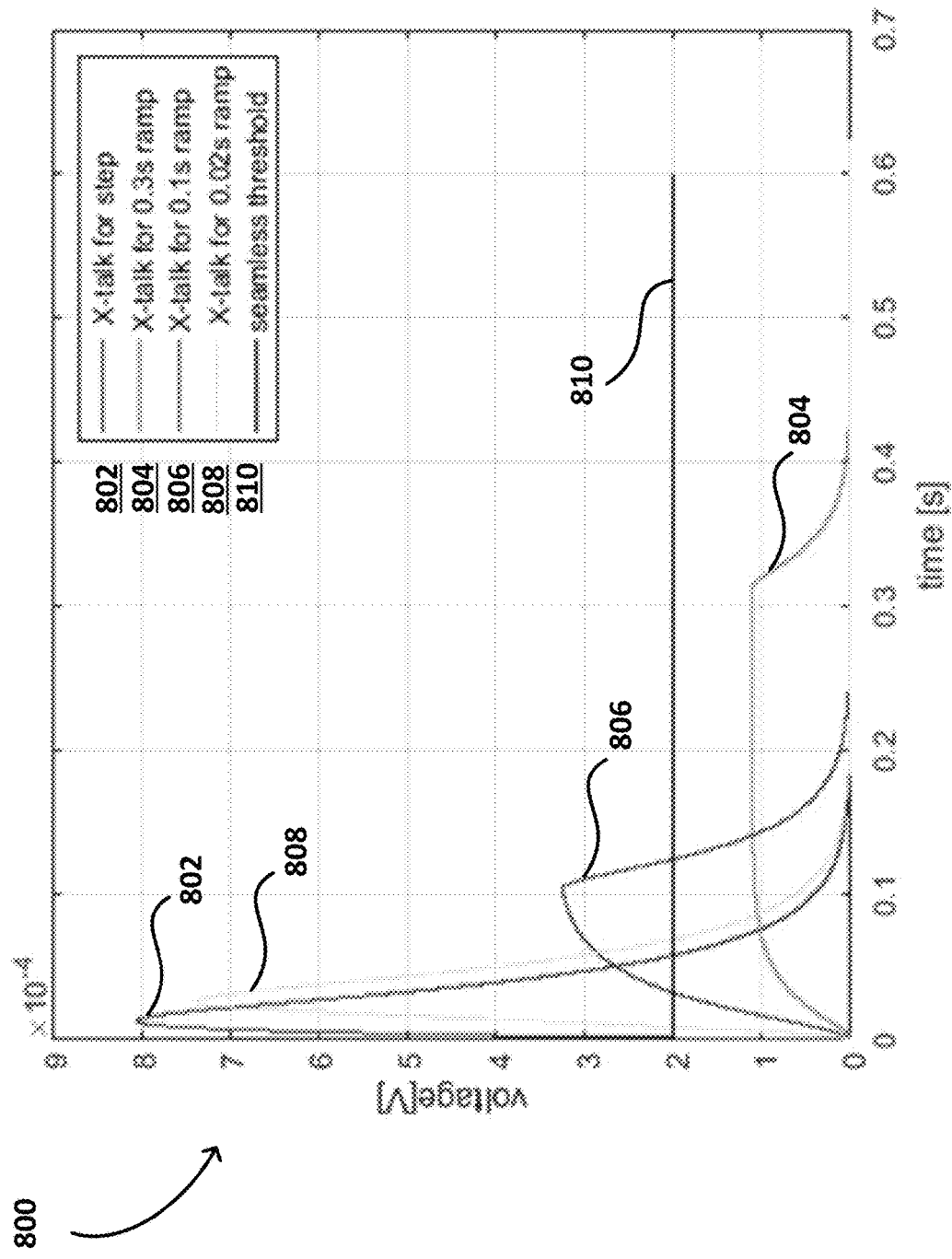
FIG. 8 is a timing diagram of X-talk voltages with respect to different switching transitions of a digital microphone for a power change of 300 μW.

FIG. 8 is a timing diagram 800 of simulated XT voltages with respect to different switching transitions of a digital microphone for a power change of about 300 µW. The power change of the digital microphone is done at different transition speeds including a slow speed ramp (0.3 sec), middle speed ramps (between 0.1 sec and 0.02 sec) and a high speed step. A seamless threshold voltage is also shown in FIG. 8, for which voltage XT signals below this threshold are inaudible.

FIG. 8 shows a X-talk response 802 for a step transition reaching a peak value of the about 0.8 millivolts, a X-talk response 808 for a 0.2 second ramp transition reaching a peak value of about 0.7 millivolts, and a X-talk response 806 for a 0.1 second ramp transition reaching a peak value of about 0.3 millivolts, all in excess of the seamless threshold 810, which is 0.2 millivolts in an embodiment. FIG. 8 also shown a X-talk response 804 for a 0.3 second ramp transition reaching a peak value of about 0.1 millivolts, which is lower than the threshold value of seamless threshold 810.

In FIG. 8 it can be observed that the faster the change in the change between the operational modes of the digital microphone, the larger the value of the corresponding X-talk artefact. Typically, slow ramps are used in digital microphones in order to reduce the amplitude of the artefacts in order to make them fall below the audible threshold.

Figure 9:
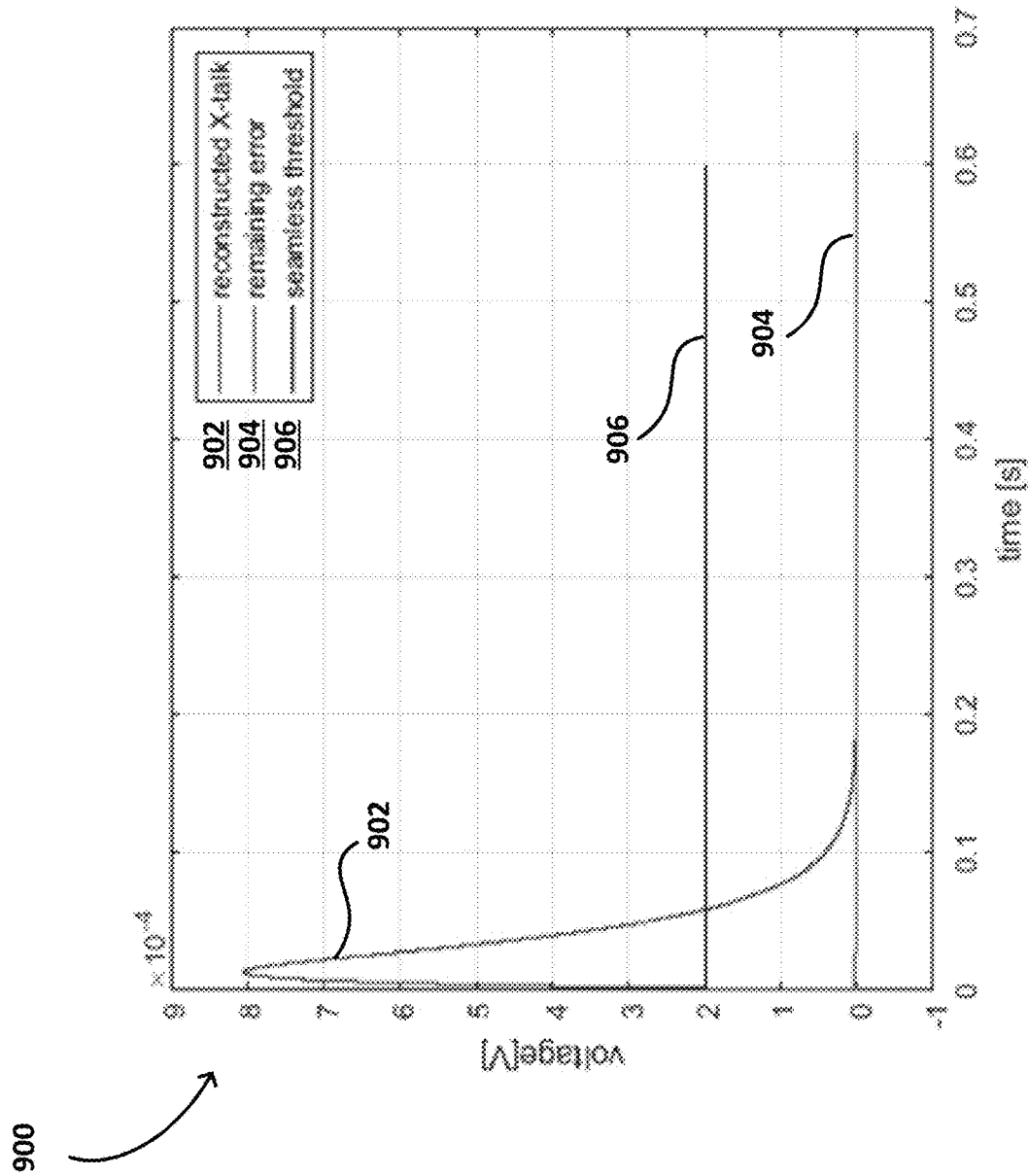
FIG. 9 is a timing diagram of X-talk voltage for a step switching transition and the remaining error after X-talk compensation is applied, according to an embodiment.

FIG. 9 is a timing diagram 900 of X-talk voltage for a step switching transition and the remaining error after X-talk compensation is applied, according to an embodiment. In particular, the reconstructed X-talk response 902 to a step transition is shown, also reaching a value of about 0.8 millivolts, well in excess of the 0.2 millivolt value of the seamless threshold 906. The reconstructed X-talk response 902 is subtracted from the main signal path during the step transition to provide a compensated output signal as previously described. In FIG. 9, the remaining X-talk value 904 (after compensation) for the worst case scenario (a step transition) is depicted. The compensated output signal has very little remaining X-talk, and is reduced even far below the slow ramp case shown in FIG. 8, which is assumed to be inaudible.

Figure 10:
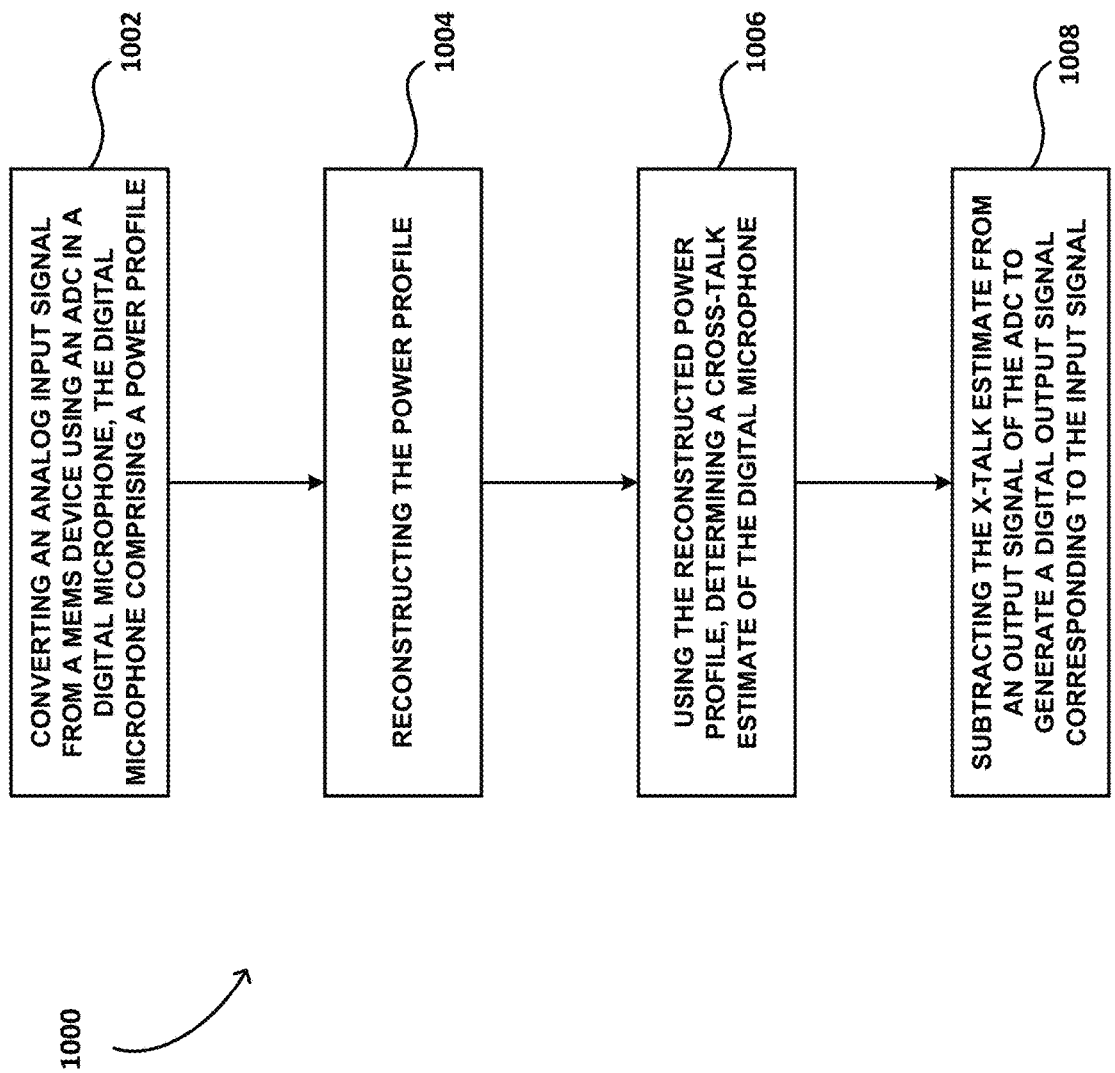
FIG. 10 is a block diagram of a method of operating a digital microphone including X-talk compensation, according to an embodiment.

FIG. 10 is a block diagram of a method 1000 of operating a digital microphone including X-talk compensation, according to an embodiment. The method 1000 includes converting an analog input signal from a microelectromechanical (MEMS) device using an analog-to-digital converter (ADC) in the digital microphone, wherein the ADC comprises a power profile while switching between first and second operating modes representing power consumption of the ADC as a function of time at step 1002; reconstructing the power profile at step 1004; using the reconstructed power profile, determining a cross-talk estimate of the digital microphone at step 1006; and subtracting the cross-talk estimate from an output signal of the ADC to generate a digital output signal corresponding to the analog input signal at step 1008.

FIG. 11 is a block diagram of a digital microphone system 1100, according to an embodiment. Digital microphone system 1100 includes a MEMS device 1102 having an analog output 1104 coupled to digital microphone 1106, which is in communication with a microprocessor 1110 through digital bus 1108 for the transfer of control signals and output signals. Digital microphone 1106 can include any of the digital microphone embodiments previously described. Microprocessor 1110 is in communication with memory 1120 through digital bus 1116 for receiving stored commands and storing data. Any suitable microprocessor or other processor, and any suitable type of memory can be used. Digital microphone system 1100 can also include other components 1118 such as other analog or digital circuits or components, such as filters, or other analog or digital circuitry specific to various product applications. Digital microphone system 1100 is only an example of the type of systems that can include the digital microphone described herein, and many other such digital microphone systems are possible while still incorporating embodiment concepts.

According to embodiments, a system and method has been described to reconstruct and subtract X-talk disturbing noise from the main signal path of a digital microphone to provide a digital output signal having very low or inaudible X-talk. The disturbing noise can occur because of power profile changes during operational mode changes of the digital microphone.

It is an advantage that the power change and corresponding change in operational mode can be performed one order of magnitude faster and any overhead analog circuitry (for example a digital-to-analog converter) can be eliminated, when compared to prior solutions.

Example 1. According to an embodiment, a circuit includes a cross-talk compensation component including a power profile reconstruction component configured for reconstructing the power profile of a digital microphone in communication with a microelectromechanical (MEMS) device, wherein the power profile represents power consumption of the digital microphone over time between at least two operational modes of the digital microphone, and a reconstruction filter configured for modeling thermal and/or acoustic properties of the digital microphone; and a subtractor having a first input configured for receiving a signal from the digital microphone, a second input coupled to the cross-talk compensation component, and an output configured for providing a digital output signal.

Example 2. The circuit of Example 1, wherein the reconstruction filter includes an input configured for receiving the reconstructed power profile.

Example 3. The circuit of any of the above examples, wherein the power profile reconstruction component includes a power change measurement component configured for measuring the power profile of the digital microphone.

Example 4. The digital microphone of any of the above examples, wherein the reconstruction filter includes a gain stage, a first digital filter configured for modeling thermal properties of the digital microphone, and a second digital filter configured for modeling acoustic properties of the digital microphone.

Example 5. The digital microphone of any of the above examples, wherein the first digital filter includes a second order digital filter.

Example 6. The circuit of any of the above examples, wherein the second digital filter includes a first order digital filter.

Example 7. The digital microphone of any of the above examples, wherein the digital microphone, the cross-talk compensation component, and the subtractor are packaged together in a semiconductor package.

Example 8. The digital microphone of any of the above examples, wherein the cross-talk compensation component and the subtractor are external to a semiconductor package of the digital microphone.

Example 9. According to an embodiment, a digital microphone includes a microelectromechanical system (MEMS) device configured for providing an analog input signal; a front-end circuit coupled to the MEMS device; an analog-to-digital converter (ADC) coupled to the front-end circuit; a first digital filter coupled to the ADC, wherein at least one of the front-end circuit, the ADC, and the first digital filter includes a power profile; a power measurement component configured for measuring power or current of the front-end circuit, the ADC, and the first digital filter; a power profile reconstruction component in communication with the power measurement component; a reconstruction filter configured for modeling thermal and/or acoustic properties of the digital microphone, wherein the reconstruction filter is in communication with the power profile reconstruction component; and a subtractor having a first input coupled to the first digital filter, a second input coupled to the reconstruction filter, and an output configured for providing a digital output signal corresponding to the analog input signal.

Example 10. The digital microphone of Example 9, wherein the power measurement component includes a voltage regulator coupled to a current sensor.

Example 11. The digital microphone of any of the above examples, wherein the voltage regulator includes a low-dropout voltage regulator having a reference voltage input, and a current input coupled to a power supply node of the front-end circuit, the ADC, and the first digital filter.

Example 12. The digital microphone of any of the above examples, wherein the current sensor includes a transistor and a sense resistor coupled to a source of the transistor.

Example 13. The digital microphone of any of the above examples, wherein the front-end circuit, the ADC, the first digital filter, the power profile reconstruction component, the power measurement component, the reconstruction filter, and the subtractor are packaged together in a semiconductor package.

Example 14. The digital microphone of any of the above examples, further including a control signal generation component coupled to a left/right (L/R) input of the digital microphone and to the ADC.

Example 15. The digital microphone of any of the above examples, further including a modulator having an input coupled to the output of the subtractor and an output configured for providing a pulse modulation density (PDM) signal.

Example 16. According to an embodiment, a method of operating a digital microphone, the method includes converting an analog input signal from a microelectromechanical (MEMS) device using an analog-to-digital converter (ADC) in the digital microphone, wherein the digital microphone includes a power profile while switching between first and second operating modes representing power consumption of the digital microphone as a function of time; reconstructing the power profile; using the reconstructed power profile; determining a cross-talk estimate of the digital microphone; and subtracting the cross-talk estimate from an output signal of the ADC to generate a digital output signal corresponding to the analog input signal.

Example 17. The method of Example 16, wherein reconstructing the power profile includes measuring power or current of the digital microphone.

Example 18. The method of any of the above examples, wherein determining the cross-talk estimate of the digital microphone includes digitally filtering the reconstructed power profile.

Example 19. The method of any of the above examples, wherein digitally filtering the reconstructed power profile includes digitally filtering the reconstructed power profile using a thermal model of the MEMS device.

Example 20. The method of any of the above examples, wherein digitally filtering the reconstructed power profile includes digitally filtering the reconstructed power profile using an acoustic model of the MEMS device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
a cross-talk compensation component comprising a power profile reconstruction component configured for reconstructing a power profile of a digital microphone in communication with a microelectromechanical (MEMS) device, wherein the power profile represents power consumption of the digital microphone over time between at least two operational modes of the digital microphone, and a reconstruction filter configured for modeling thermal and/or acoustic properties of the digital microphone; and
a subtractor having a first input configured for receiving a signal from the digital microphone, a second input coupled to the cross-talk compensation component, and an output configured for providing a digital output signal.

2. The circuit of claim 1, wherein the reconstruction filter comprises an input configured for receiving the reconstructed power profile.

3. The circuit of claim 1, further comprising a power change measurement component coupled to the cross-talk compensation component and configured for measuring the power profile of the digital microphone.

4. The circuit of claim 1, wherein the reconstruction filter comprises a gain stage, a first digital filter configured for modeling thermal properties of the digital microphone, and a second digital filter configured for modeling acoustic properties of the digital microphone.

5. The circuit of claim 4, wherein the first digital filter comprises a second order digital filter.

6. The circuit of claim 4, wherein the second digital filter comprises a first order digital filter.

7. The circuit of claim 1, wherein the digital microphone, the cross-talk compensation component, and the subtractor are packaged together in a semiconductor package.

8. The circuit of claim 1, wherein the cross-talk compensation component and the subtractor are external to a semiconductor package of the digital microphone.

9. A digital microphone, comprising:
a microelectromechanical (MEMS) device; and
a cross-talk compensation component, including:
a power profile reconstruction component configured for reconstructing a power profile of the digital microphone, where the power profile represents power consumption of the digital microphone over time between at least two operational modes of the digital microphone;
a reconstruction filter configured for modeling at least one of thermal or acoustic properties of the digital microphone; and
a subtractor having a first input configured for receiving a signal in the digital microphone, a second input coupled to the cross-talk compensation component, and an output configured for providing a digital output signal.

10. The digital microphone of claim 9, wherein the reconstruction filter comprises an input configured for receiving the reconstructed power profile.

11. The digital microphone of claim 9, further comprising a power change measurement component coupled to the cross-talk compensation component and configured for measuring the power profile of the digital microphone.

12. The digital microphone of claim 9, wherein the reconstruction filter comprises a gain stage, a first digital filter configured for modeling thermal properties of the digital microphone, and a second digital filter configured for modeling acoustic properties of the digital microphone.

13. The digital microphone of claim 12, wherein the first digital filter comprises a second order digital filter.

14. The digital microphone of claim 12, wherein the second digital filter comprises a first order digital filter.

15. The digital microphone of claim 9, wherein the digital microphone, the cross-talk compensation component, and the subtractor are packaged together in a semiconductor package.

16. The digital microphone of claim 1, wherein the cross-talk compensation component and the subtractor are external to a semiconductor package of the digital microphone.

17. A method of operating a digital microphone, the digital microphone including a microelectromechanical (MEMS) device and a cross-talk compensation component including a power profile reconstruction component configured for reconstructing a power profile of the digital microphone in communication with the MEMS device, wherein the power profile represents power consumption of the digital microphone over time between at least two operational modes of the digital microphone, and a reconstruction filter configured for modeling thermal and/or acoustic properties of the digital microphone, and further includes a subtractor having a first input configured for receiving a signal from the digital microphone, a second input coupled to the cross-talk compensation component, and an output configured for providing a digital output signal;
the method comprising:
converting an analog input signal from the MEMS device using an analog-to-digital converter (ADC) in the digital microphone;
reconstructing the power profile using the power profile reconstruction component;
determining, from the reconstructed power profile, a cross-talk estimate of the digital microphone using the cross-talk compensation component; and subtracting the cross-talk estimate from an output signal of the ADC to generate a digital output signal corresponding to the analog input signal from the MEMS device.

18. The method of claim 17, wherein reconstructing the power profile comprises measuring power or current of the digital microphone.

19. The method of claim 17, wherein determining the cross-talk estimate of the digital microphone comprises digitally filtering the reconstructed power profile.

20. The method of claim 19, wherein digitally filtering the reconstructed power profile comprises digitally filtering the reconstructed power profile using one of a thermal model of the MEMS device and an acoustic model of the MEMS device.

* * * * *